United States Patent
Rountree

(10) Patent No.: US 8,866,200 B2
(45) Date of Patent: Oct. 21, 2014

(54) JFET ESD PROTECTION CIRCUIT FOR LOW VOLTAGE APPLICATIONS

(71) Applicant: Robert Newton Rountree, Cotopaxi, CO (US)

(72) Inventor: Robert Newton Rountree, Cotopaxi, CO (US)

(*) Notice: Subject to any disclaimer, the term of this patent is extended or adjusted under 35 U.S.C. 154(b) by 0 days.

(21) Appl. No.: 13/772,105

(22) Filed: Feb. 20, 2013

(65) Prior Publication Data

US 2013/0214333 A1 Aug. 22, 2013

Related U.S. Application Data

(60) Provisional application No. 61/601,186, filed on Feb. 21, 2012.

(51) Int. Cl.
*H01L 27/06* (2006.01)
*H01L 27/02* (2006.01)

(52) U.S. Cl.
CPC ........ *H01L 27/0629* (2013.01); *H01L 27/0266* (2013.01)
USPC .................... 257/256; 327/430; 257/E27.148

(58) Field of Classification Search
USPC ......... 257/134, 213, 256, 173, 272, 274, 287, 257/504, E27.148, E29.265, E29.314, 257/E21.403, E21.407, E21.401, E21.421; 438/186; 327/430
See application file for complete search history.

(56) References Cited

U.S. PATENT DOCUMENTS

| | | | |
|---|---|---|---|
| 4,939,616 A | 7/1990 | Rountree | |
| 5,012,317 A | 4/1991 | Rountree | |
| 5,296,409 A * | 3/1994 | Merrill et al. | 438/189 |
| 5,465,189 A | 11/1995 | Polgreen et al. | |
| 5,670,393 A * | 9/1997 | Kapoor | 438/186 |
| 6,239,958 B1 * | 5/2001 | Kato et al. | 361/56 |
| 6,251,716 B1 | 6/2001 | Yu | |
| 7,009,229 B1 | 3/2006 | Lin et al. | |
| 7,164,160 B2 | 1/2007 | Pendharker et al. | |
| 7,211,845 B1 | 5/2007 | Yu et al. | |
| 7,655,964 B1 | 2/2010 | Lin et al. | |
| 2003/0227034 A1 * | 12/2003 | Davis | 257/256 |
| 2005/0173726 A1 * | 8/2005 | Potts | 257/134 |
| 2009/0285414 A1 * | 11/2009 | Wu | 381/113 |
| 2011/0220973 A1 * | 9/2011 | Hu et al. | 257/272 |
| 2013/0032812 A1 * | 2/2013 | Kizilyalli et al. | 257/76 |

* cited by examiner

*Primary Examiner* — Selim Ahmed

(57) ABSTRACT

An electrostatic discharge (ESD) protection circuit is disclosed. The circuit includes a first terminal (200), a first power supply terminal (Vdd), and a second power supply terminal (Vss). The circuit further includes a junction field effect transistor (JFET) having a current path coupled between the first terminal and the second power supply terminal. The JFET has a control terminal (202) coupled to the first power supply terminal.

20 Claims, 3 Drawing Sheets

JFET ESD PROTECTION CIRCUIT FOR LOW VOLTAGE APPLICATIONS

This application claims the benefit under 35 U.S.C. §119 (e) of Provisional Appl. No. 61/601,186, filed Feb. 21, 2012, which is incorporated herein by reference in its entirety.

BACKGROUND OF THE INVENTION

Embodiments of the present embodiments relate to a CMOS-compatible junction field effect transistor (JFET) for electrostatic discharge (ESD) protection of low-voltage integrated circuits.

Referring to FIG. 1A, there is a current-voltage diagram of a semiconductor controlled rectifier (SCR) of the prior art. FIG. 1B is a simplified diagram of the SCR showing the PNPN impurity layers and intervening junctions J1-J3. The current-voltage diagram shows a reverse blocking region 100 where junctions J1 and J3 are reverse biased, but junction J2 is forward biased. By way of contrast, junctions J1 and J3 are forward biased, but junction J2 is reverse biased in the forward blocking region 102. At switching voltage Vsw 104, the SCR switches from the forward blocking region to a minimum holding voltage (Vh) and holding current (Ih) region 106. Each point along line 108 is a relatively higher holding current and holding voltage, and the slope of line 108 represents the on resistance of the SCR. In this mode all three junctions J1-J3 are forward biased and the minimum holding voltage across the SCR may be as low as a single diode drop or approximately 0.7 V. In holding regions 106 and 108, therefore, the SCR functions as a near ideal switch with very little power dissipation due to the low holding voltage and holding current.

SCRs have been used for primary protection against electrostatic discharge (ESD) for several years. Rountree first disclosed a lateral SCR for ESD protection in U.S. Pat. No. 5,012,317, issued Apr. 30, 1991, having a priority date of at least Apr. 14, 1986. The SCR was also described in detail by Rountree et al. in "A Process Tolerant Input Protection Circuit for Advanced CMOS Processes" (EOS/ESD Symposium Proceedings, pp. 201-205, 1988). The SCR provided a significant improvement in failure threshold over existing ESD protection circuits. However, it required a relatively high switching voltage (Vsw) to induce avalanche conduction at the N− and P− linear junction J2.

Rountree subsequently disclosed a low voltage SCR for ESD protection in U.S. Pat. No. 4,939,616, issued Jul. 3, 1990, having a priority date of at least Nov. 1, 1988. The low voltage SCR maintained the substantially improved failure threshold of the original lateral SCR. The low voltage SCR also substantially reduced the switching voltage (Vsw) required for avalanche conduction by forming an abrupt junction J2 between N+ and P− regions.

Polgreen et al. later disclosed an even lower voltage SCR for ESD protection in U.S. Pat. No. 5,465,189, issued Nov. 7, 1995, having a priority date of at least Mar. 5, 1990. This SCR modified the SCR of U.S. Pat. No. 4,939,616 by adding a grounded gate n-channel transistor between junctions J2 and J3. The increased electric field at the gate-to-drain overlap region near junction J2 induced avalanche conduction at the SCR switching voltage, which was substantially lower than previously disclosed lateral SCRs. (col. 4, lines 30-35). At the same time, the SCR raised several reliability concerns, because the SCR functioned as a grounded gate n-channel transistor between the forward blocking region 102 and the switching voltage 104. For some processes and test conditions, therefore, it is possible that the gate oxide at the gate-to-drain overlap region near junction J2 may rupture before the SCR turns on.

A common feature of the foregoing SCRs is that the switching voltage of each is determined by the avalanche threshold of p-n junction J2. Other circuits have included secondary protection circuits, such as an isolation resistor and grounded gate n-channel transistor, to achieve a relatively lower switching voltage. This, however, requires the avalanche threshold of the n-channel transistor plus the voltage drop across the isolation resistor to forward bias junction J1. Others have used series-connected diodes to forward bias junction J1 or J3. Still others have used junction-isolated base regions to reduce SCR switching (Vsw) and holding (Vh) voltages. This, however, may require a triple well process or other special isolation techniques. Moreover, the SCRs are negative resistance circuits. Any application of a low impedance control signal before the integrated circuit is adequately powered up, therefore, may cause the SCR to latch and destroy itself. The foregoing SCR protection circuits become less effective as integrated circuit operating voltages are reduced to less than 1.0 V. At such low voltages, integrated circuit components having thin gate oxide and small feature sizes may be damaged at SCR switching and holding voltages. These and other problems are resolved by the following embodiments of the present invention as will become apparent in the following discussion.

BRIEF SUMMARY OF THE INVENTION

In a preferred embodiment of the present invention, a protection circuit is disclosed. The circuit includes a first terminal, a first power supply terminal, and a second power supply terminal. A junction field effect transistor (JFET) has a current path coupled between the first terminal and the second power supply terminal. A control terminal of the JFET is coupled to the first power supply terminal. The JFET operates as a resistor when an electrostatic discharge (ESD) voltage is applied to the JFET. The circuit avoids a need for thin oxide transistors and is compatible with complementary metal oxide semiconductor (CMOS) processes.

DETAILED DESCRIPTION OF THE INVENTION

The preferred embodiments of the present invention provide significant advantages over electrostatic discharge (ESD) protection circuits of the prior art as will become evident from the following detailed description.

Figure 1A:
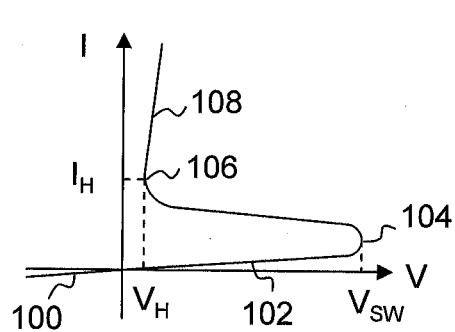
FIG. 1A is a current-voltage diagram of a semiconductor controlled rectifier (SCR) of the prior art.
Figure 1B:
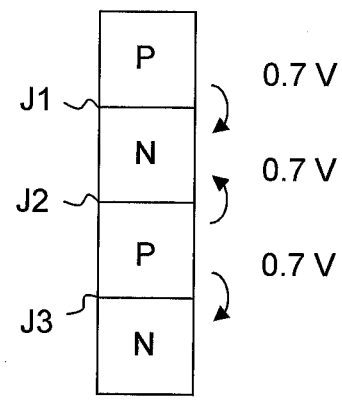
FIG. 1B is a simplified diagram of an SCR of the prior art.
Figure 2:
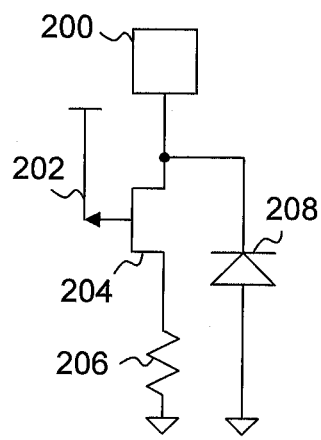
FIG. 2 is a schematic diagram of a junction field effect (JFET) electrostatic discharge (ESD) protection circuit of the present invention.

Referring to FIG. 2, there is a schematic diagram of a junction field effect (JFET) electrostatic discharge (ESD) protection circuit of the present invention. The circuit is coupled to a first terminal 200, which may be a data terminal, an address terminal, or a control terminal. Here and in the following discussion the same identification numerals are used to indicate the same elements. By way of example, JFET 204 is a p-channel, enhancement mode JFET. One of ordinary skill in the art having access to the instant specification will understand embodiments of the present invention will apply to an n-channel enhancement mode JFET as well. The enhancement mode JFET 204 is "normally off" when the gate-to-source voltage (Vgs) is greater (more positive) than or equal to 0 V. JFET 204 has a current path coupled between the first terminal 200 and power supply terminal Vss or ground, indicated by the small triangle, via resistor 206. Resistor 206 represents channel resistance and parasitic substrate resistance as will be discussed in detail. A control terminal 202 of the JFET is coupled to power supply terminal Vdd. A diode 208 is also coupled between the first terminal 200 and Vss.

Figure 3:
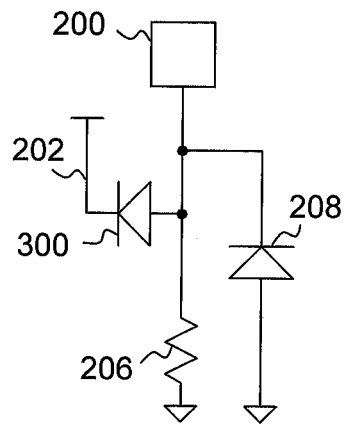
FIG. 3 is a schematic diagram of an equivalent circuit of the circuit of FIG. 2 when gate-to-source voltage exceeds the JFET threshold voltage.

In operation, the JFET 204 conducts positive ESD stress current between terminal 200 and ground, and diode 208 conducts negative ESD stress current between terminal 200 and ground. When positive power supply voltage Vdd is applied to control terminal 202, the integrated circuit is powered up and the voltage at terminal 200 is no greater than Vdd. Thus, Vgs is greater than or equal to 0 V for normal circuit operation. In this mode, JFET 204 is off and no current flows through resistor 206. When a positive voltage such as during ESD stress is applied to terminal 200, the JFET conducts current to ground through resistor 206. This mode of operation is illustrated by the equivalent circuit of FIG. 3. Here, JFET 204 is on and has a low channel resistance and substrate resistance 206. Positive ESD stress applied to terminal 200 in this mode will be conducted to ground and through resistor 206 and to Vdd through diode 300 with very little power dissipation. This mode of operation is highly advantageous for several reasons. First, there are no switching or holding voltages to potentially damage integrated circuits operating at very low voltages. Second, the protection circuit operates in a positive resistance mode, so there is no danger as with negative resistance circuits of the prior art which utilize snapback or latchup. For example, the circuit can not latch and destroy itself or preferentially current hog at isolated regions of the JFET. Third, the JFET operates in a very low resistance mode during ESD stress, so there is very little power dissipation and resulting heat generation. Fourth, no thin oxide MOS transistors are required by the protection circuit that might be damaged by overvoltage during ESD stress. Finally, the protection circuit is compatible with present complementary metal oxide semiconductor processes as will be discussed in detail.

Figure 4:
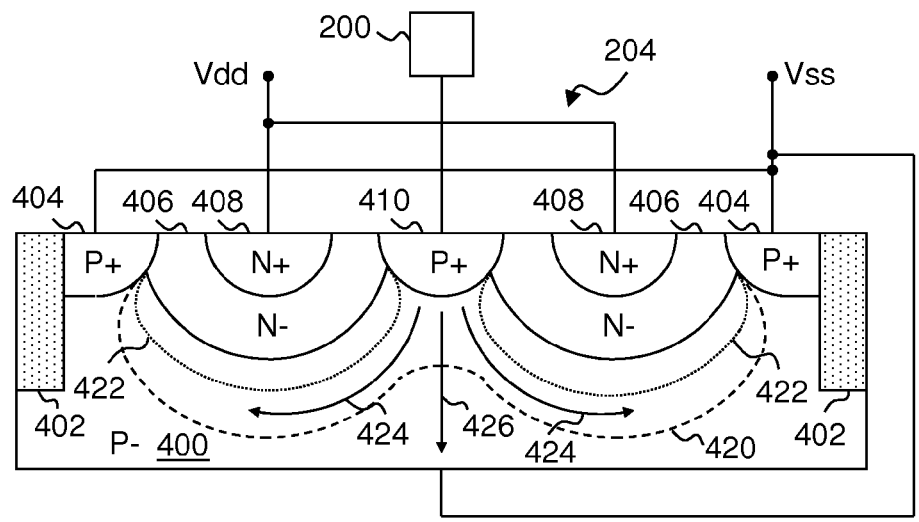
FIG. 4 is a cross sectional diagram of a JFET of the present invention.

Turning now to FIG. 4, there is a cross sectional diagram of JFET 204 of FIG. 2. Here and in the following discussion, heavily doped regions are indicated by a "+" and lightly doped regions are indicated by a "−". This designation indicates that the heavily doped regions have a much higher impurity concentration than the lightly doped regions. The JFET 204 includes P+ source region 410 connected to terminal 200 and a gate formed by N− regions 406. N− gate regions 406 are electrically connected to power supply terminal Vdd by N+ regions 408. A drain is formed by P+ regions 404 and by P− substrate 400, both of which are electrically connected to the Vss power supply terminal. JFET 204, therefore, has both a lateral current path 424 between P+ source 410 and P+ regions 404 as well as a vertical current path 426 between P+ source 410 and P− substrate 400. Due to the electrically parallel lateral 424 and vertical 426 current paths, the on resistance of JFET 204 including resistance 206 is small. JFET 204 is preferably bounded by isolation regions 402.

Figure 5:
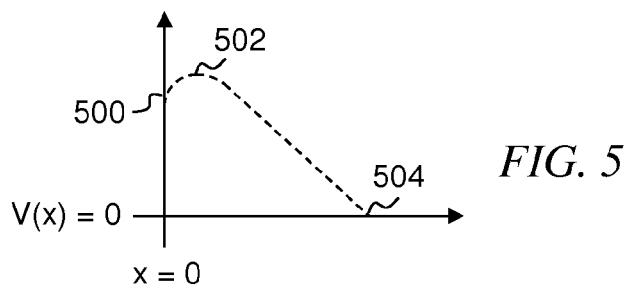
FIG. 5 is a potential diagram along the channel region of the JFET of FIG. 4 during normal circuit operation.

In normal operation, JFET 204 is designed as an enhancement mode p-channel JFET. Two conditions are necessary for enhancement mode operation. First, the channel must be fully depleted when Vgs is greater than or equal to 0 V. Second, the built-in voltage at the center of the channel must be greater than the source voltage. Often, when one of these conditions is met, the other is also satisfied. Here, the first condition is illustrated by N−/P− depletion edge 420 during normal operation. The channel region between P+ source 410 and P− substrate 400 is completely depleted. FIG. 5 is a potential diagram illustrating the potential V(x) from the P+ source 410 to depletion edge 420 through the center of the channel. The value of V(x) 500 at x=0 is the most positive value of the P+ source 410 during normal circuit operation. The value of V(x) 504 at depletion edge 420 is approximately Vss, since no current flows through the JFET during normal circuit operation. The value of V(x) at 502 is slightly more positive than the source potential at 500 due to the built-in voltage of the N−/P− junctions. This satisfies the second condition for enhancement mode operation. For typical CMOS processes having a P− well impurity concentration of 6e15 A/cm^3 to 1e16 A/cm^3 and N− well impurity concentration of 4e16 A/cm^3, both conditions are typically satisfied for the N− to P− linear junction with a gate spacing of approximately 0.8 µm to 0.5 µm. The gate space should also be designed to maintain an enhancement mode threshold voltage for JFET 204 over the entire range of operating temperature.

As positive voltage is applied to terminal 200 of JFET 204, Vgs becomes increasingly negative. The gate depletion region narrows to depletion edges 422, and a conductive channel forms in the center of JFET 204. As previously discussed, the channel has both a lateral current path between P+ source 410 and P+ regions 404 as well as a vertical current path between P+ source 410 and P− substrate 400. These electrically parallel lateral and vertical current paths produce a very low on resistance of JFET 204 having resistance 206, so there is little heat generation during an ESD event.

Figure 6A:
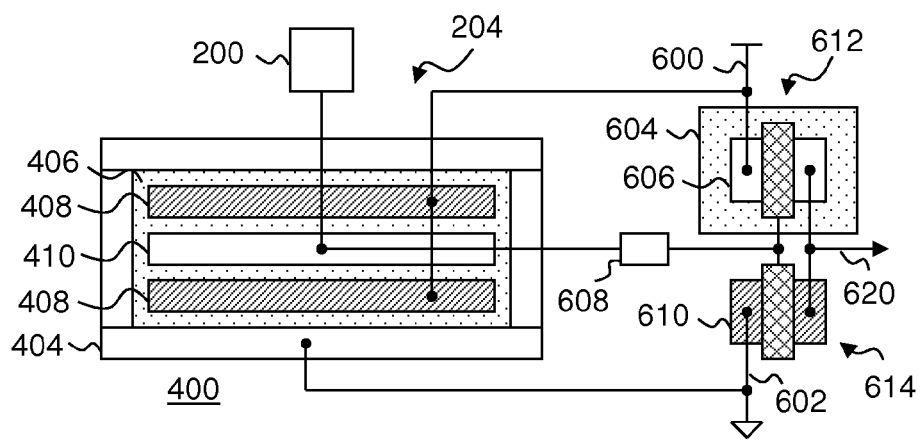
FIG. 6A is a simplified layout diagram of the JFET of FIG. 4 and a typical CMOS inverter.

Referring now to FIG. 6A, there is a simplified layout of JFET 204 of FIG. 4 and a typical CMOS inverter. The P+ source 410 of JFET 204 is connected to terminal 200. The P− substrate 400 and P+ regions 404 are connected to ground or Vss 602. The N+/N− gate regions 408 and 406, respectively, are connected to Vdd power supply terminal 600. The CMOS inverter includes p-channel transistor 612 and n-channel transistor 614. The input of the CMOS inverter is connected to the P+ source 410 by isolation stage 608. The isolation stage is optional and may be an isolation resistor and diode or similar structure as is known in the art. The output terminal 620 is connected to internal circuitry of the integrated circuit. In a preferred embodiment of the present invention, N− region 604 is formed by the same ion implantation step as N− gate region 406. N+ region 610 is formed by the same ion implantation step as N+ gate region 408. Likewise, P+ region 606 is formed by the same ion implantation step as P+ source region 410 and P+ regions 404. This is highly advantageous, and renders JFET 204 of the present invention compatible with typical CMOS processes.

Figure 6B:
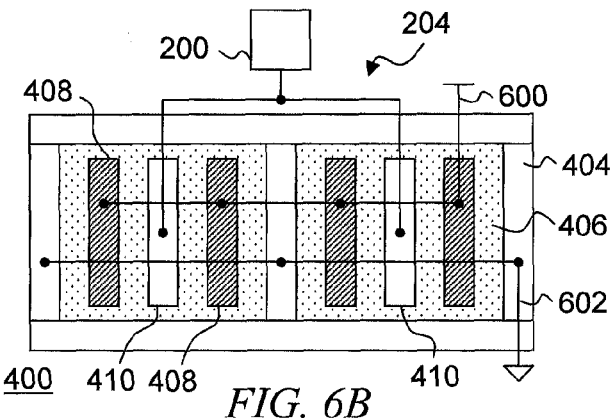
FIG. 6B is another simplified layout diagram of the JFET of FIG. 4.

Referring to FIG. 6B, there is another simplified layout of JFET 204 of FIG. 4. The P+ sources 410 of JFET 204 are connected to terminal 200. The P– drain 400 and P+ regions 404 are connected to ground or Vss 602. The N+/N– gate regions 408 and 406, respectively, are connected to Vdd power supply terminal 600. This embodiment of the present invention having distributed source regions 410 is highly advantageous in providing multiple parallel JFETs that may be included with output circuits as in FIG. 7. A distributed layout of JFET 204 as in FIG. 6B is not practical with negative resistance circuits that operate in snapback or latchup modes. This is because any one of the negative resistance circuits might turn on first and prevent operation of the other negative resistance circuits. The JFET of FIG. 6B, however, is a positive resistance circuit and precludes current such hogging.

Figure 7:
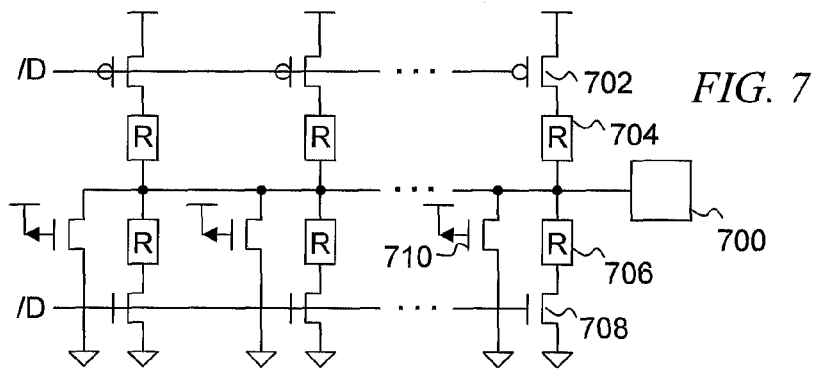
FIG. 7 is a schematic diagram of a data output circuit having the JFET ESD protection circuit of FIG. 4.

Turning now to FIG. 7, there is a schematic diagram of a data output circuit having the JFET ESD protection circuit of FIG. 4. The output circuit of FIG. 7 is a multiple finger output circuit having a distributed JFET protection circuit of the present invention. Here, only three fingers of the output circuit are shown for simplicity. Each finger includes a p-channel transistor 702 connected to output terminal 700 by series resistor 704. Each finger further includes an n-channel transistor 708 connected to output terminal 700 by series resistor 706. Each finger is preferably protected by a respective JFET 710 of the present invention. JFET 710 operates as previously described, but it is divided into multiple JFETs for inclusion within the output circuit. As previously mentioned with regard to JFET 204, each JFET 710 is a positive resistance device. Thus, there is no danger of current hogging by any single finger.

Figure 8:
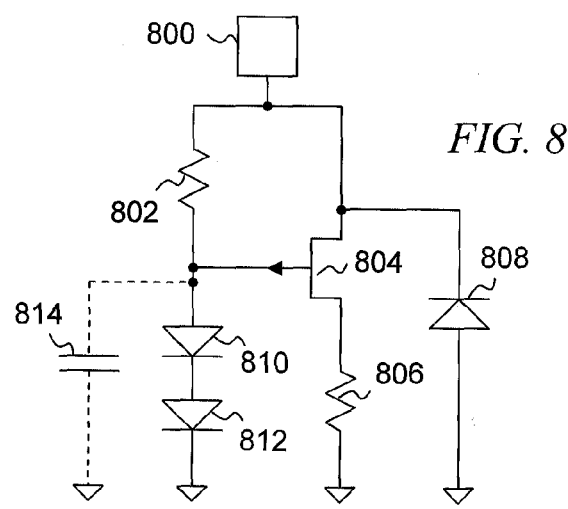
FIG. 8 is a schematic diagram of a power supply protection circuit having the JFET ESD protection circuit of FIG. 4.

Referring to FIG. 8, there is a schematic diagram of a power supply protection circuit having the JFET ESD protection circuit of FIG. 4. The power supply protection circuit includes JFET 804 connected between Vdd terminal 800 and Vss. JFET 804 may be structurally the same as JFET 204. JFET 804 preferably conducts positive ESD stress current between terminal 800 and ground, and diode 808 conducts negative ESD stress current between terminal 800 and ground. Resistor 806 is preferably the same as resistor 206 (FIG. 2). A control terminal of JFET 804 is connected to Vdd terminal 800 by resistor 802. The control terminal of JFET 804 is also connected to the Vss terminal by series-connected diodes 810 and 812. Capacitor 814 is optional and may be connected in parallel with diodes 810 and 812.

In operation, the power supply protection circuit of FIG. 8 remains off during normal circuit operation. JFET 804 is designed as an enhancement mode device, having the source and control gate connected to Vdd terminal 800. For normal circuit operation, therefore, Vgs=0 and JFET 804 remains off. Moreover, for a power supply voltage of less than 1.2 V, diodes 810 and 812 are not forward biased and remain off. During a normal power up cycle, capacitor 814 and resistor 802 are designed with a sufficiently small time constant that JFET 804 is never on.

When a positive ESD voltage is applied to terminal 800 with respect to Vss, JFET 804 will turn on in one of two ways. First, if the rise time of the ESD voltage is sufficient to overcome the time constant of resistor 802 and capacitor 814, JFET 804 will turn on when Vgs exceeds the threshold voltage. For example, if the integrated circuit is not powered up and the control terminal of JFET 804 is floating near Vss potential, a voltage greater than Vgs at terminal 800 will turn on JFET 804 and discharge the ESD stress voltage. Second, series diodes 810 and 812 clamp the control terminal of JFET 804 at two diode drops above Vss. An additional threshold voltage across resistor 802 will turn on JFET 804 without regard to the rise time of the ESD stress voltage. If the rise time of the ESD voltage is slow, therefore, a voltage of two diode drops plus a threshold voltage at terminal 800 will turn on JFET 804 and discharge the ESD stress voltage. This is highly advantageous in providing ESD protection for fast rise time ESD tests such as the charged device model (CDM) test and the machine model (MM) test as well as slower rise time tests such as the human body model test (HBM).

Still further, while numerous examples have thus been provided, one skilled in the art should recognize that various modifications, substitutions, or alterations may be made to the described embodiments while still falling with the inventive scope as defined by the following claims. For example, preferred embodiments of the present invention have illustrated protection circuit designs with p-channel JFETs. The previously described circuits will also work with n-channel JFETs formed on n-type substrates or in n-well regions. Other combinations will be readily apparent to one of ordinary skill in the art having access to the instant specification.

What is claimed is:

1. An electrostatic discharge (ESD) protection circuit, comprising:
    a substrate;
    a first terminal formed at a face of the substrate;
    a first circuit coupled to the first terminal of the ESD protection circuit;
    a first power supply terminal;
    a plurality of second power supply terminals formed at the face of the substrate;
    a third power supply terminal formed below the face of the substrate and connected to the substrate; and
    an enhancement mode junction field effect transistor (JFET) having a channel arranged to conduct a first current between the first terminal and the plurality of second power supply terminals and a second current different from the first current between the first terminal and the third power supply terminal.

2. A protection circuit as in claim 1, wherein the first power supply terminal is a positive power supply terminal and wherein the second power supply terminal is ground.

3. A protection circuit as in claim 1, wherein the first terminal is one of a data terminal, an address terminal, and a control terminal.

4. A protection circuit as in claim 1, wherein the first terminal is coupled to a control terminal of the JFET by a resistor.

5. A protection circuit as in claim 1, wherein the first terminal is coupled to the second power supply terminal by at least one diode.

6. A protection circuit as in claim 1, wherein the plurality of second power supply terminals are connected to the third power supply terminal.

7. A protection circuit as in claim 1, wherein the channel conducts plural parallel currents, each parallel current including a lateral current between the first terminal and the plurality of second power supply terminals and a vertical current between the first terminal and the third power supply terminal.

8. A protection circuit as in claim 1, wherein the junction field effect transistor is formed on a substrate together with a complementary metal oxide semiconductor (CMOS) circuit.

9. A power supply electrostatic discharge (ESD) protection circuit, comprising:
    a substrate;
    a first power supply terminal;
    a plurality of second power supply terminals formed at a face of the substrate;
    a third power supply terminal formed below the face of the substrate and connected to the substrate; and an enhancement mode junction field effect transistor (JFET) having a channel arranged to conduct a first current between the first power supply terminal and the plurality of second power supply terminals and a second current different from the first current between the first power supply terminal and the third power supply terminal.

10. A circuit as in claim 9, comprising a control terminal coupled to the first power supply terminal by a resistor, wherein the control terminal is coupled to a capacitor, and wherein the first power supply terminal is coupled to the second power supply terminal by at least one diode.

11. A circuit as in claim 9, wherein the plurality of second power supply terminals are connected to the third power supply terminal.

12. A circuit as in claim 9, coupled to a complementary metal oxide semiconductor (CMOS) circuit.

13. An electrostatic discharge (ESD) protection circuit, comprising:
- a first region having a first conductivity type formed at a face of a substrate;
- a gate having a second conductivity type formed in the substrate at the sides of the first region;
- a plurality of second regions having the first conductivity type formed at the face of the substrate beside the gate; and
- a channel having the first conductivity type formed below the first region and arranged to conduct a first current between the first region and the plurality of second regions and a second current different from the first current between the first region and the substrate.

14. An ESD protection circuit as in claim 13, wherein the channel is arranged to conduct the first and second currents in response to a voltage applied to the gate.

15. An ESD protection circuit as in claim 13, wherein the gate comprises a heavily doped region formed at least partially within a lightly doped region.

16. An ESD protection circuit as in claim 13, wherein the first region is coupled to one of a data terminal, an address terminal, and a control terminal.

17. An ESD protection circuit as in claim 13, comprising:
- a first power supply terminal coupled to the first region; and
- a second power supply terminal coupled to the second and third regions.

18. An ESD protection circuit as in claim 13, comprising a P-channel enhancement mode junction field effect transistor.

19. An ESD protection circuit as in claim 13, comprising:
- a P-channel metal oxide semiconductor (MOS) transistor having a source coupled to a first power supply terminal and a drain coupled to the first region; and
- an N-channel MOS transistor having a source coupled to a second power supply terminal and a drain coupled to the first region.

20. An ESD protection circuit as in claim 19, wherein the source of the P-channel transistor is formed by a same ion implantation step as one of the first and second regions.

* * * * *